United States Patent
Praeger et al.

(10) Patent No.: US 9,423,437 B2
(45) Date of Patent: Aug. 23, 2016

(54) ARRANGEMENT FOR IDENTIFYING A SWITCHING POSITION OF A SWITCH ON AN INTERNAL COMBUSTION ENGINE IN A HANDHELD WORK APPARATUS

(71) Applicant: Andreas Stihl AG & Co. KG, Waiblingen (DE)

(72) Inventors: Joerg Praeger, Winnenden (DE); Franz Mandl, Fellbach (DE); Robert Boeker, Winnenden (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 362 days.

(21) Appl. No.: 13/953,546

(22) Filed: Jul. 29, 2013

(65) Prior Publication Data
US 2014/0028332 A1    Jan. 30, 2014

(30) Foreign Application Priority Data

Jul. 27, 2012 (DE) .......................... 10 2012 014 925

(51) Int. Cl.
| | |
|---|---|
| G01R 27/26 | (2006.01) |
| H01H 9/16 | (2006.01) |
| F02B 63/02 | (2006.01) |
| H03K 17/18 | (2006.01) |
| H01H 9/06 | (2006.01) |

(52) U.S. Cl.
CPC .......... *G01R 27/2611* (2013.01); *H01H 9/167* (2013.01); *F02B 63/02* (2013.01); *H01H 9/06* (2013.01); *H03K 17/18* (2013.01)

(58) Field of Classification Search
CPC .......... H05B 33/089; G01R 19/16542; G01R 31/36; G01R 31/3637
See application file for complete search history.

(56) References Cited

U.S. PATENT DOCUMENTS

| | | | | |
|---|---|---|---|---|
| 6,166,525 A | * | 12/2000 | Crook ................. | F02N 11/0803 290/30 B |
| 2011/0114055 A1 | * | 5/2011 | Naegele ................ | F02D 41/042 123/198 DB |

* cited by examiner

*Primary Examiner* — Arleen M Vazquez
*Assistant Examiner* — Alesa Allgood
(74) *Attorney, Agent, or Firm* — Walter Ottesen, P.A.

(57) ABSTRACT

The invention relates to an arrangement for identifying a switching position of a switch (on an internal combustion engine in a handheld work apparatus. An energy source for supplying power to an inductive electrical load is provided, it being possible to connect the load to the energy source in order to be switched on and off via a controller. The switch is arranged in a voltage branch which is connected in parallel with the inductive load and in which a zener diode is also connected. The zener diode is activated or inactivated via the switch as a function of the switching position of the switch. The amplitude of the switch-off voltage, which is induced when the inductive load is disconnected, is limited by the zener diode, so that it is possible to read from the magnitude of the amplitude whether the switch is closed or open.

22 Claims, 2 Drawing Sheets

ARRANGEMENT FOR IDENTIFYING A SWITCHING POSITION OF A SWITCH ON AN INTERNAL COMBUSTION ENGINE IN A HANDHELD WORK APPARATUS

CROSS REFERENCE TO RELATED APPLICATION

This application claims priority of German patent application no. 10 2012 014 925.5, filed Jul. 27, 2012, the entire content of which is incorporated herein by reference.

BACKGROUND OF THE INVENTION

Sensors which are intended to establish, for example, the position of the choke flap (start condition), the position of the throttle flap, the condition of the operating state of a safety braking device and the like, are arranged in portable, handheld work apparatus in order to ensure functionally reliable operation of an internal combustion engine. A short-circuiting switch is also provided, the engine being switched off when the short-circuiting switch is actuated. The sensor signals are used to control, for example, an electromagnetic fuel valve which serves to meter the quantity of fuel which is appropriate for the particular operating state.

All of these sensors, which are configured, for example, as microswitches, can be electrically connected to a control unit which evaluates the sensor signals and accordingly controls the operation of the internal combustion engine. The electrical wiring of the sensors to the control unit is very complex.

SUMMARY OF THE INVENTION

It is an object of the invention to provide an arrangement for identifying a switching position of a sensor, for example of an electrical switch, on an internal combustion engine in a handheld work apparatus in such a manner that the complexity for electrical wiring is reduced.

The arrangement of the invention is for identifying a switch position of a switch on an internal combustion engine in a handheld work apparatus. The arrangement includes: a control; an inductive electrical load; an energy source configured to supply the inductive electrical load with energy; the inductive electrical load being connected to the energy source via the control so as to be switched on and off; a first voltage branch disposed parallel to the inductive load; the switch being a first switch having a first and a second switch position and being arranged in the first voltage branch; a first zener diode arranged in the first voltage branch; the first zener diode being configured to be switched to an active state and an inactive state in dependence upon the switch position of the first switch; the inductive load being configured to cause an induced switch-off voltage having an amplitude when the inductive load is switched off; and, the first zener diode being configured to limit the amplitude of the induced switch-off voltage.

An inductive load, for example a pulse-width-controlled electromagnetic fuel valve, which is arranged on the internal combustion engine, is actuated, that is, switched on and off by an electrical controller of the internal combustion engine at controlled time intervals during operation of the internal combustion engine. According to the invention, the switch-off voltage which is induced in a system-related manner when an inductive electrical load is disconnected is used in order to identify the current switching position of a switch. To this end, the switch is arranged in a voltage branch which is connected in parallel with the inductive load. At least one zener diode is also arranged in this voltage branch, the zener diode being reverse-biased with respect to the switch-off voltage. This or these one or more zener diodes are activated or deactivated as a function of the switching position of the switch; when the zener diode is active, the amplitude of the switch-off voltage is limited to the component-specific breakdown voltage of the one or more zener diodes. Therefore, a switch-off voltage can be tapped off from the connection lines of the inductive load, the switch off voltage being limited to the breakdown voltage of the one or more zener diodes which are associated with the switch, or having another value as a function of the position of the electrical switch. Since the connection lines of the inductive load are anyway connected to the controller, wiring of the switch from its site of installation to the controller, which would otherwise be necessary, can be dispensed with; in the controller, the switch-off voltage which is applied to the connection lines of the load after the load is disconnected can be tapped off and the magnitude of its amplitude can be evaluated, as a result of which the switch position can be identified. Simple wiring of the switch to the inductive load is sufficient, for example in the form of a bus system.

The maximum amplitude, which is tapped off from the load, of the induced switch-off voltage therefore allows a statement to be made about whether the switch which is to be monitored is open or closed in the voltage branch which is connected in parallel with the load.

The amplitude of the induced switch-off voltage which is produced across the load as a function of the position of the switch can therefore be evaluated by an evaluation unit which is expediently integrated in the controller.

A plurality of voltage branches which are connected in parallel are advantageously provided for the electrical load, and at least on zener diode, which is switched by a switch, is provided in each of these voltage branches. The one or more zener diodes have different breakdown voltages in this case, with the result that either the breakdown voltage of the one or another zener diode can be tapped off from the inductive load after it is disconnected. Therefore, an evaluation unit can immediately indicate, on the basis of the magnitude of the tapped-off switch-off voltage, whether the one or other switch is closed.

In a simple embodiment of the arrangement, the switch and the zener diode are electrically connected to one another in series. If the switch is closed, the zener diode is activated; if the switch is open, the zener diode is inactive.

As an alternative, provision can be made to arrange a plurality of switches in series with one another in a voltage branch, wherein each switch switches in each case one zener diode, the zener diodes having different breakdown voltages. In this case, the switches are connected in parallel with the zener diode, with the result that individual zener diodes which are connected in a cascade are switched by the switch position. If the switch is closed, the zener diode is short-circuited and therefore inactive; if the switch is open, the zener diode is active. In this case, provision is made to connect the zener diode to ground and to block the zener diode in the forward direction by a blocking diode. This ensures that no current can flow and no short circuit is produced in the parallel voltage branch during operation of the inductive load.

A series circuit having a reference zener diode and a blocking diode which is connected anti-parallel is advantageously connected in parallel with the load. In this case, the sum of all the breakdown voltages of the zener diodes which can be connected via switches is smaller than the breakdown voltage of the reference zener diode.

The voltage amplitude of the negative switch-off voltage, which voltage is induced when the inductive electrical load is disconnected and the direction of which voltage is applied against the polarity of the operating voltage, is limited by at least one respective zener diode. The inductive electrical load is preferably an electromagnetic valve, in particular an electromagnetic fuel valve, which is switched on and off when the crankshaft of the internal combustion engine rotates in accordance with a pulse width of the actuating signal, in order to meter an appropriate quantity of fuel to the internal combustion engine for operation.

Each switch in a voltage branch is assigned a priority, wherein the priority is determined by the breakdown voltage of the associated zener diode. In this case, the switch with the highest priority is advantageously assigned a zener diode with the lowest breakdown voltage in the system.

The arrangement according to the invention can be used to identify the switching position of a plurality of switches which are arranged on an internal combustion engine, via the connection lines of the inductive load, for example a choke switch which is arranged on a choke, a throttle flap switch which is arranged on the throttle flap, a short-circuiting switch as a stop switch for turning off the motor or an operating switch on a safety braking device.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
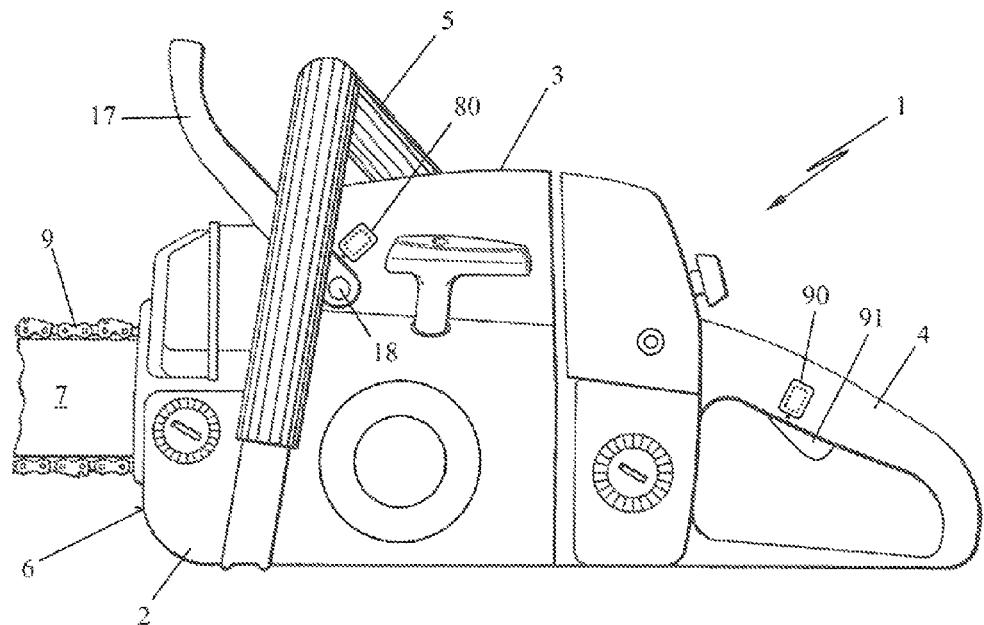
FIG. 1 is a schematic side view of a portable work apparatus.

The handheld, portable work apparatus 1 shown in FIG. 1 is a chainsaw 2 which essentially has a housing 3 as the main body. An internal combustion engine 20 (FIG. 2) is arranged in the housing in the exemplary embodiment. The portable work apparatus 1 can also be configured in the form of cut-off machine, a blower apparatus, a brushcutter, a hedge trimmer or similar work apparatus.

A rear handle 4 is provided in the longitudinal direction of the work apparatus 1; a bale handle as the front handle 5 is arranged in the front region of the housing, this handle spanning the housing 3 transverse to the longitudinal direction of the work apparatus 1. A hand-guard 17 is fitted in front of the front handle 5, it expediently being possible for the hand-guard to be pivoted about an axis 18 and the hand-guard forming the trigger for a safety braking device which is not shown in any more detail.

A guide bar 7 is mounted on the end 6 of the housing 3 which is situated opposite the rear handle 4 so as to extend in the longitudinal direction of the work apparatus 1. A saw chain 9 is guided peripherally on the peripheral guide groove of the guide bar as a work tool of the work apparatus 1.

Figure 2:
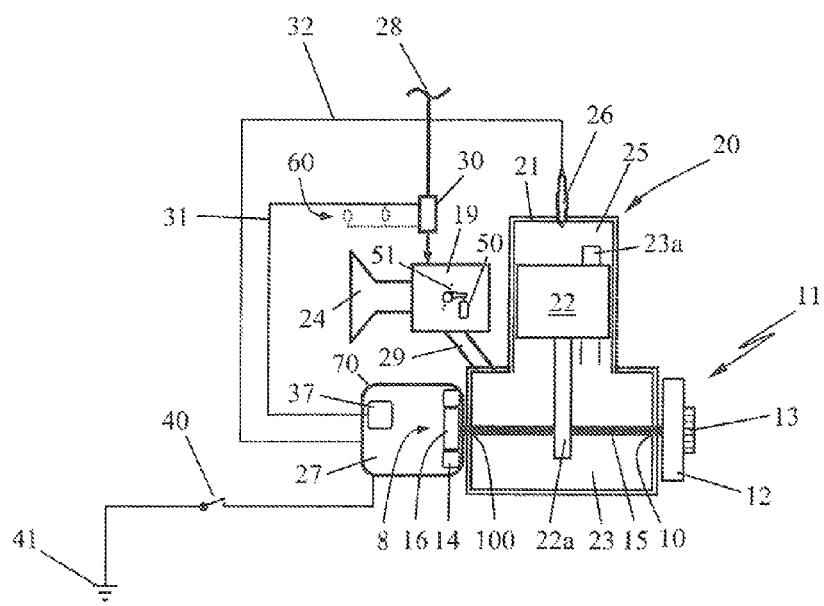
FIG. 2 shows a basic circuit diagram of an internal combustion engine with an arrangement for identifying the switching position of a switch.

The internal combustion engine 20, which is arranged in the housing 3, is schematically shown in FIG. 2 and preferably configured as a single-cylinder two-stroke engine.

According to the embodiment shown, the internal combustion engine is made of a cylinder 21 with a piston 22 and also of a crankcase 23 with a crankshaft 15. The crankshaft 15 is rotatably mounted in the crankcase 23 and is drive-connected to a clutch 11 at one end 10. The clutch is a centrifugal clutch in the embodiment shown. The driven clutch drum 12 is fixedly connected with a drive sprocket 13 so that the latter rotates therewith. The drive sprocket drives the saw chain 9 (FIG. 1) peripherally on the guide bar 7.

A generator 14 is arranged at the other end 100 of the crankshaft 15 as an electrical energy source 8. The generator is associated with a rotating pole wheel 16 which can be, for example, a fan wheel of the internal combustion engine 20.

The piston 22 delimits a combustion chamber 25 in the cylinder 21. A spark plug 26, which is activated by an ignition module 27, projects into the combustion chamber. The ignition module 27 can be configured as a common component with the generator 14 and form a controller 70 for the internal combustion engine 20.

The fuel/air mixture required for operating the internal combustion engine 20 is supplied to the combustion chamber 25 via a carburetor 19. The carburetor 19 draws in combustion air via an air filter 24. The combustion air is admixed with fuel in the carburetor housing. The fuel is supplied via a fuel line 28 and a fuel valve 30, whereby the fuel valve 30 is an electromagnetically controlled fuel valve which is driven by the controller 70. The prepared mixture is drawn into the crankcase 23 of the internal combustion engine 20 via an intake duct 29, in order to then—in accordance with the crankcase scavenging which is known per se in two-stroke engines—flow into the combustion chamber 25 via transfer channels 23a which are controlled by the piston 22.

During operation of the internal combustion engine 20, an ignitable fuel/air mixture is delivered to the combustion chamber 25 and compressed by the upwardly moving piston 22. An ignition spark is triggered at the spark plug 26 by the ignition module 27 in the region of the top dead center of the piston 22, the mixture is ignited and the piston 22 is driven downward. The upward and downward movement of the piston 22 is converted into a rotary movement of the crankshaft 15 via a connection rod 22a.

A short-circuiting switch 40 is provided in order to switch off the internal combustion engine. The short-circuiting switch connects an input of the ignition module 27 to ground 41.

For the purpose of reliable operation of the internal combustion engine 20 in different operating states, in particular in the start position, it is practical to use a position sensor which detects the start position and which is arranged on a choke flap 51 of the carburetor 19 as an electrical switch 50 in the embodiment shown. As shown in FIG. 2, the switch 50 is closed when the choke flap 51 is closed, so that the ignition module 27, as the controller 70, recognizes the start position and, on the one hand, actuates the fuel valve 30 via the control line 31 for metering an appropriate, relatively large quantity of fuel, and, on the other hand, triggers an ignition spark on the spark plug 26 via the ignition cable 32 at correspondingly changed ignition times.

Figure 3:
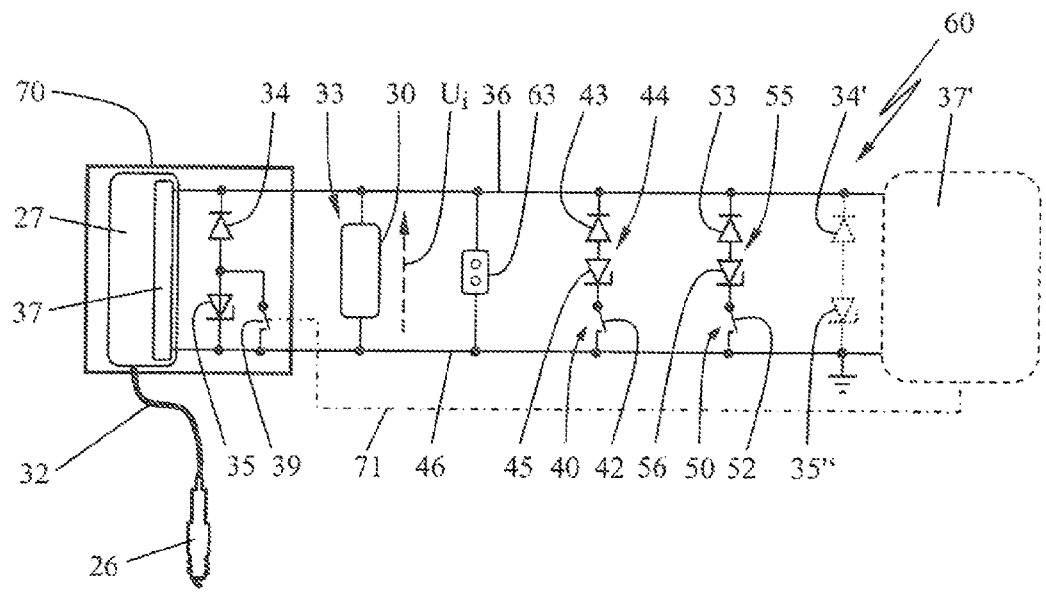
FIG. 3 shows a basic electrical circuit diagram of a first embodiment of an arrangement for identifying a switching position of a switch; and, FIG. 4 shows a basic electrical circuit diagram of a second arrangement for identifying a switching position of a switch.
Figure 4:
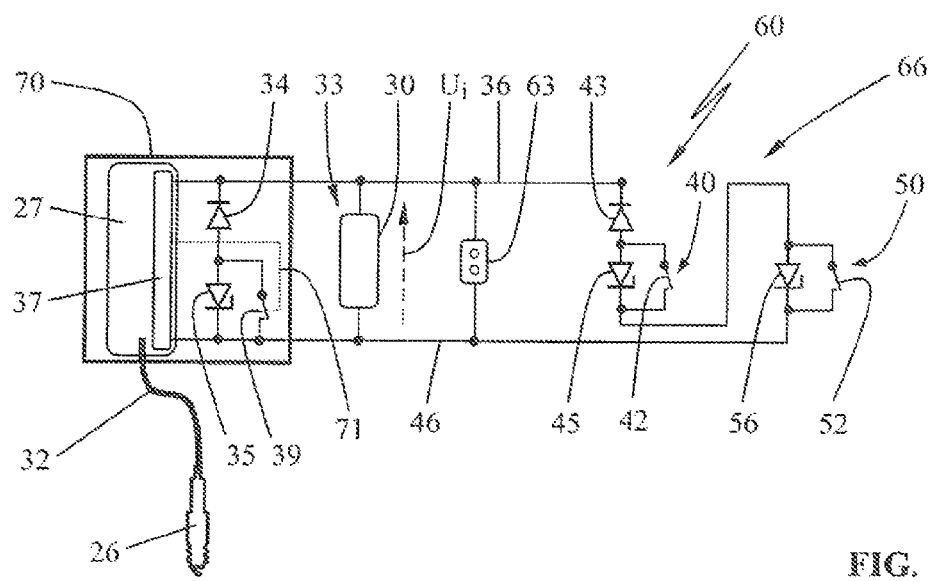

In order to keep the complexity on wiring for the position switch, which is arranged on an internal combustion engine 20, sensors and the like, low, provision is made to form an identification circuit 60 for checking the position sensors according to FIGS. 3 and 4 which are arranged on an internal combustion engine. The position sensors are preferably electrical switches such as microswitches or the like and show a specific operating state of the monitored element. If an electrical switch 50 of this kind is arranged on a choke flap 51, the contact 52 is always closed when the choke flap 51 is closed, as illustrated in dashed lines in FIG. 2. A further switch 40 may be, for example, a short-circuiting switch for turning off the engine, as shown in FIG. 2. If the contact 42 is closed, the ignition module 27 Is connected to ground 41 and is inactive; the ignition is switched off.

The identification circuit 60 according to the invention can also be used to check the switching states of further switches. For example, a switch 80 can be arranged on the trigger (hand-guard 17) of the safety braking device (FIG. 1), the switch indicating, for example, an engaged safety brake. A switch 90 can also be arranged on a throttle lever 91 which is provided in the handle 4 (FIG. 1), the switch always switching when the throttle lever 91 is in the full-throttle position.

In the embodiment according to FIGS. 3 and 4, the fuel valve 30 forms at inductive electrical load 33 which is actuated by the ignition module 27 as a controller 70. When the fuel valve 30 is switched off, the collapsing magnetic field in the coil will generate a negative switch-off voltage $U_i$ which is limited by a zener diode 35 which is provided in the ignition module 27 as a control device. To this end, the zener diode 35 is connected in parallel with the fuel valve 30, a blocking diode 34 being connected back-to-back in series with the zener diode and preventing a short circuit in the pulsed mode (PWM) of the fuel valve 30.

A protective circuit which includes the zener diode 35' and the blocking diode 34' can also be provided—as shown on the right-hand side of FIG. 3 in dashed lines—outside the controller 70 or the ignition module 27, for example as a line termination of the connection lines 36 and 46 of the inductive load 33.

The contact 42 of the short-circuiting switch 40 is electrically connected in a voltage branch 44 which is connected in parallel with the inductive electrical load 33. A zener diode 45, which is connected to ground in the forward direction and which has an associated blocking diode 43 which is connected back-to-back in series, is connected in series with the contact 42 of the short-circuiting switch 40 which is to be switched.

In the same manner, the switch 50 of the position sensor, which is arranged on the choke flap and which is connected in series with a zener diode 56 which is connected to ground in the forward direction and a blocking diode 53 which is connected anti-parallel, is provided in a further voltage branch 55, which is connected in parallel with the inductive electrical load 33, of the position sensor which is arranged on the choke flap.

In the circuit diagram according to FIG. 3, the zener diode (45, 56) is activated when the switch (40, 50) is closed; the zener diode (45, 56) is inactive when the switch (40, 50) is open.

The zener diodes 35, 45 and 56 have different breakdown voltages, for example 4 volts, 6 volts and 8 volts. In the exemplary embodiment, the zener diode 35 has a breakdown voltage of 8 volts, the zener diode 45 has a breakdown voltage of 4 volts, and the zener diode 56 has a breakdown voltage of 6 volts. The short-circuiting switch 40 therefore has the highest priority; the choke flap switch 50 has the second priority.

During operation of the internal combustion engine 20, a switch-off voltage $U_i$, which is directed against the voltage which generates the magnetic field, is in each case induced when the fuel valve, 30 is switched off, the switch off voltage being reduced via the zener diodes (35, 45, 56). If, for example, the short-circuiting switch 40 is closed, the negative amplitude of the switch-off voltage $U_i$ is limited to 4 volts by the zener diode 45 which is connected in parallel with the inductive electrical load 33. An evaluation unit 37, which is expediently integrated in the controller 70, evaluates the amplitude of the switch-off voltage, which is tapped off between the lines, after the load 33 is disconnected; if a maximum amplitude of 4 volts is determined, the switch-off voltage through the diode 45 is determined; as a result, the switch 40 is closed, and therefore the short-circuiting switch is closed. The controller 70 will trigger turn-off of the engine.

Even if the switch 50 of the choke flap is closed at the same time in the parallel voltage branch 55, the controller 70 will reliably identify the closed short-circuiting switch 40 since this has the highest priority, that is, the zener diode 45 has the lowest breakdown voltage. Since all the voltage branches (44, 55) are connected in parallel with one another, the induced switch-off voltage $U_i$ is determined from the lowest breakdown voltage of the zener diodes (45, 56) which are connected in parallel, that is to say the limiting of the amplitude of the switch-off voltage $U_i$ is always limited by the zener diode 45 of the short-circuiting switch 40. Irrespective of the switching state of the switch 50 of the choke flap 51, the controller 70 can reliably identify the closed position of the short-circuiting switch 40 at any time on the basis of the lowest switch-off voltage on the lines (36, 46) of the fuel valve 30.

If the short-circuiting switch 40 is opened and the switch 50 of the choke flap 51 is closed, the evaluation unit 37 will determine a maximum switch-off voltage of 6 volts between the electrical lines (36, 46) of the fuel valve 30 and therefore identify that the choke flap 51 is closed, that is, the internal combustion engine is in the start state. Accordingly, the controller 70 or the ignition module 27 of the controller 70 can actuate the fuel valve 30 and the spark plug 26 for starting.

It can be advantageous to bridge the reference zener diode 35, which is provided in the ignition module 27, at the time at which the fuel valve 30 is switched off. To this end, a switch 39 is provided, the switch expediently being actuated by the evaluation unit 37 or the ignition module 27 via a control line 71. The evaluation unit 37 can be provided as a separate module, as illustrated in dashed lines on the right-hand side of FIG. 3 for example, or can be expediently integrated in the ignition module 27, as shown in FIG. 4.

In the exemplary embodiment according to FIG. 4, a plurality of switches (40, 50) are connected in series with one another in the same voltage branch 66, wherein each switch (40, 50) is connected in series with in each case one zener diode (45, 56) and the zener diodes (45, 56) are activated or deactivated. These zener diodes 45 and 56 also have different breakdown voltages in such a manner that a corresponding priority is assigned to the switches 40 and 50. Since the zener diodes (45, 56) are connected in series, the breakdown voltages are added up when the zener diode is activated (switch open); if the switch (40, 50) is closed, the zener diode (45, 56) is electrically short-circuited and is therefore electrically inactive.

Assuming a relatively small breakdown voltage in the zener diode 45 of the switch 40 and a relatively large breakdown voltage in the zener diode 56 of the switch 50 of the choke flap, the following situation occurs during operation:

if the short-circuiting switch 40 which is connected in parallel with the zener diode 45 is closed, the induced voltage $U_i$ is limited to the breakdown voltage of the zener diode 56. If the switch 50 parallel to the zener diode 56 is also closed, the amplitude of the induced voltage $U_i$ is—when the switch 39 is open—limited to the breakdown voltage of the reference zener diode 35. If both switches 40 and 50 are open—and the switch 39 is open—this state can be identified by the amplitude of the induced voltage $U_i$ being limited to the sum of the breakdown voltages of the zener diodes 45 and 56. The evaluation unit 37, which is expediently integrated in the ignition module 37, can therefore identify the switching state of the switches 40 and 50 on the basis of the maximum switch-off voltage $U_i$ which is briefly applied between the lines 36 and 46 when the fuel valve 30 is switched off.

Furthermore, a diagnosis socket 63 can be connected to the lines 36 and 46 of the inductive load 33, in the exemplary embodiment of the fuel valve 30, in order to communicate, for example to update a microprocessor which is integrated in the controller, to play new software, to change operating data or to read a fault memory, with the controller 70 via the connection lines (36, 46) of the fuel valve 30 when the internal combustion engine 20 is stationary.

It is understood that the foregoing description is that of the preferred embodiments of the invention and that various changes and modifications may be made thereto without departing from the spirit and scope of the invention as defined in the appended claims.

What is claimed is:

1. An arrangement for identifying a switch position of a switch on an internal combustion engine in a handheld work apparatus, the arrangement comprising:
    a control;
    an inductive electrical load;
    an energy source configured to supply said inductive electrical load with energy;
    said inductive electrical load being connected to said energy source via said control so as to be switched on and off;
    a first voltage branch disposed parallel to said inductive electrical load;
    said switch being a first switch having a first and a second switch position and being arranged in said first voltage branch;
    a first zener diode arranged in said first voltage branch;
    said first zener diode being configured to be switched to an active state and an inactive state in dependence upon the switch position of said first switch;
    said inductive electrical load being configured to cause an induced switch-off voltage having an amplitude when said inductive electrical load is switched off;
    said first zener diode being configured to limit said amplitude of said induced switch-off voltage; and,
    an evaluation unit configured to evaluate said amplitude of said switch-off voltage which adjusts in dependence upon the position of said first switch.

2. The arrangement of claim 1, wherein said first switch and said first zener diode are connected electrically in series.

3. The arrangement of claim 1, wherein said induced switch-off voltage is a negative voltage and said amplitude of said induced switch-off voltage is limited by said first zener diode.

4. An arrangement for identifying a switch position of a switch on an internal combustion engine in a handheld work apparatus, the arrangement comprising:
    a control;
    an inductive electrical load;
    an energy source configured to supply said inductive electrical load with energy;
    said inductive electrical load being connected to said energy source via said control so as to be switched on and off;
    a first voltage branch disposed parallel to said inductive electrical load;
    said switch being a first switch having a first and a second switch position and being arranged in said first voltage branch;
    a first zener diode arranged in said first voltage branch;
    said first zener diode being configured to be switched to an active state and an inactive state in dependence upon the switch position of said first switch;
    said inductive electrical load being configured to cause an induced switch-off voltage having an amplitude when said inductive electrical load is switched off;
    said first zener diode being configured to limit said amplitude of said induced switch-off voltage;
    a second voltage branch connected in parallel to said electrical inductive load;
    said first zener diode having a first breakdown voltage;
    a second zener diode arranged in said second voltage branch and having a second breakdown voltage different from said first breakdown voltage; and,
    a second switch configured to switch said second zener diode between first and second switch positions thereof.

5. The arrangement of claim 4, wherein said inductive electrical load is an electromagnetic fuel valve.

6. The arrangement of claim 4, wherein said first switch is one of a choke switch, a throttle flap switch and a stop switch configured to shut off the internal combustion engine.

7. The arrangement of claim 4, wherein:
    said first and second switches are assigned respective priorities; and,
    the priority of each of said first and second switches is determined by the breakdown voltage of the zener diode corresponding thereto.

8. The arrangement of claim 7, wherein the switch having the highest priority is the switch associated with the zener diode having the lowest breakdown voltage.

9. An arrangement for identifying a switch position of a switch on an internal combustion engine in a handheld work apparatus, the arrangement comprising:
    a control;
    an inductive electrical load;
    an energy source configured to supply said inductive electrical load with energy;
    said inductive electrical load being connected to said energy source via said control so as to be switched on and off;
    a first voltage branch disposed parallel to said inductive electrical load;
    said switch being a first switch having a first and a second switch position and being arranged in said first voltage branch;
    a first zener diode arranged in said first voltage branch;
    said first zener diode being configured to be switched to an active state and an inactive state in dependence upon the switch position of said first switch;
    said inductive electrical load being configured to cause an induced switch-off voltage having an amplitude when said inductive electrical load is switched off;
    said first zener diode being configured to limit said amplitude of said induced switch-off voltage;
    a second switch arranged in series with said first switch;
    a second zener diode having a second breakdown voltage;
    said first zener diode having a first breakdown voltage;
    said second switch being configured to switch said second zener diode to an active and inactive state; and,
    said first breakdown voltage being different than said second breakdown voltage.

10. The arrangement of claim 9, wherein:
    said first switch being arranged in parallel to said first zener diode; and,
    said second switch being arranged in parallel to said second zener diode.

11. The arrangement of claim 9, wherein said electrical load is an electromagnetic fuel valve.

12. The arrangement of claim 9, wherein said first switch is one of a choke switch, a throttle flap switch and a stop switch configured to shut off the internal combustion engine.

13. An arrangement for identifying a switch position of a switch on an internal combustion engine in a handheld work apparatus, the arrangement comprising:
a control;
an inductive electrical load;
an energy source configured to supply said inductive electrical load with energy;
said inductive electrical load being connected to said energy source via said control so as to be switched on and off;
a first voltage branch disposed parallel to said inductive electrical load;
said switch being a first switch having a first and a second switch position and being arranged in said first voltage branch;
a first zener diode arranged in said first voltage branch;
said first zener diode being configured to be switched to an active state and an inactive state in dependence upon the switch position of said first switch;
said inductive electrical load being configured to cause an induced switch-off voltage having an amplitude when said inductive electrical load is switched off;
said first zener diode being configured to limit said amplitude of said induced switch-off voltage;
said first zener diode being connected to ground and having a forward direction; and,
a blocking diode configured to block said first zener diode in said forward direction.

14. The arrangement of claim 13, wherein said electrical load is an electromagnetic fuel valve.

15. The arrangement of claim 13, wherein said first switch is one of a choke switch, a throttle flap switch and a stop switch configured to shut off the internal combustion engine.

16. An arrangement for identifying a switch position of a switch on an internal combustion engine in a handheld work apparatus, the arrangement comprising:
a control;
an inductive electrical load;
an energy source configured to supply said inductive electrical load with energy;
said inductive electrical load being connected to said energy source via said control so as to be switched on and off;
a first voltage branch disposed parallel to said inductive electrical load;
said switch being a first switch having a first and a second switch position and being arranged in said first voltage branch;
a first zener diode arranged in said first voltage branch;
said first zener diode being configured to be switched to an active state and an inactive state in dependence upon the switch position of said first switch;
said inductive electrical load being configured to cause an induced switch-off voltage having an amplitude when said inductive electrical load is switched off;
said first zener diode being configured to limit said amplitude of said induced switch-off voltage;
a series circuit connected in parallel with said inductive electrical load;
a reference zener diode arranged in said series circuit; and,
a blocking diode arranged in said series circuit so as to be connected anti-parallel with said reference zener diode.

17. The arrangement of claim 16, wherein:
said first zener diode has a first breakdown voltage; and,
said reference zener diode has a second breakdown voltage which is greater than said first breakdown voltage.

18. The arrangement of claim 16, wherein said electrical load is an electromagnetic fuel valve.

19. The arrangement of claim 16, wherein said first switch is one of a choke switch, a throttle flap switch and a stop switch configured to shut off the internal combustion engine.

20. An arrangement for identifying a switch position of a switch on an internal combustion engine in a handheld work apparatus, the arrangement comprising:
a control;
an inductive electrical load;
an energy source configured to supply said inductive electrical load with energy;
said inductive electrical load being connected to said energy source via said control so as to be switched on and off;
a plurality of voltage branches disposed parallel to said inductive load;
each of said voltage branches including a switch having first and second switch positions;
each of said voltage branches including a zener diode arranged therein;
each of said zener diodes having a respective breakdown voltage being configured to be switched to an active state and an inactive state in dependence upon the switch position of the switch corresponding thereto;
said inductive load being configured to cause an induced switch-off voltage having an amplitude when said inductive load is switched off;
said zener diodes being configured to limit said amplitude of said induced switch-off voltage;
a series circuit connected in parallel with said inductive electrical load;
a reference zener diode arranged in said series circuit and having a reference breakdown voltage;
a blocking diode arranged in said series circuit so as to be anti-parallelly connected; and,
the sum of all breakdown voltages of said zener diodes being less than said reference breakdown voltage of said reference zener diode.

21. The arrangement of claim 20, wherein said electrical load is an electromagnetic fuel valve.

22. The arrangement of claim 20, wherein said first switch is one of a choke switch, a throttle flap switch and a stop switch configured to shut off the internal combustion engine.

* * * * *